(12) United States Patent  
Call et al.

(10) Patent No.: US 9,633,914 B2  
(45) Date of Patent: Apr. 25, 2017

(54) SPLIT BALL GRID ARRAY PAD FOR MULTI-CHIP MODULES

(71) Applicant: INTERNATIONAL BUSINESS MACHINES CORPORATION, Armonk, NY (US)

(72) Inventors: Anson J. Call, Poughkeepsie, NY (US); Erwin B. Cohen, South Burlington, VT (US); Dany Minier, Granby (CA); Wolfgang Sauter, Vail, CO (US); David B. Stone, Jericho, VT (US); Eric W. Tremble, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/854,553

(22) Filed: Sep. 15, 2015

(65) Prior Publication Data

US 2017/0077000 A1    Mar. 16, 2017

(51) Int. Cl.
*H01L 21/66* (2006.01)
*H01L 23/498* (2006.01)
*H01L 21/48* (2006.01)

(52) U.S. Cl.
CPC .......... *H01L 22/20* (2013.01); *H01L 21/4853* (2013.01); *H01L 22/14* (2013.01); *H01L 22/32* (2013.01); *H01L 23/49816* (2013.01); *H01L 23/49844* (2013.01)

(58) Field of Classification Search
None
See application file for complete search history.

(56) References Cited

U.S. PATENT DOCUMENTS

| 6,646,349 B1 | 11/2003 | Pu et al. | |
| 2002/0125043 A1* | 9/2002 | Yoshida | H01L 22/34 174/261 |
| 2011/0291288 A1* | 12/2011 | Wu | H01L 23/49827 257/774 |
| 2013/0077275 A1* | 3/2013 | Kariyazaki | H01L 23/49838 361/783 |
| 2014/0117552 A1* | 5/2014 | Qian | H01L 23/49827 257/762 |

* cited by examiner

*Primary Examiner* — Matthew Reames
*Assistant Examiner* — Steven B Gauthier
(74) *Attorney, Agent, or Firm* — Schmeiser, Olsen & Watts, LLP; Steven J. Meyers

(57) ABSTRACT

A multi-chip module and method of fabricating a multi-chip module. The multi-chip module includes: a substrate having a top surface and a bottom surface and containing multiple wiring layers, first pads on the top surface of the substrate and second pads on the bottom surface of the substrate; a first active component attached to a first group of the first pads and a second active component attached to a second group of the first pads; wherein at least one pad of the second pads is a split pad having a first section and a non-contiguous second section separated by a gap, the first section connected by a first wire of the multiple wires to a pad of the first group of first pads and the second section is connected by a second wire of the multiple wires to a pad of the second group of first pads.

6 Claims, 5 Drawing Sheets

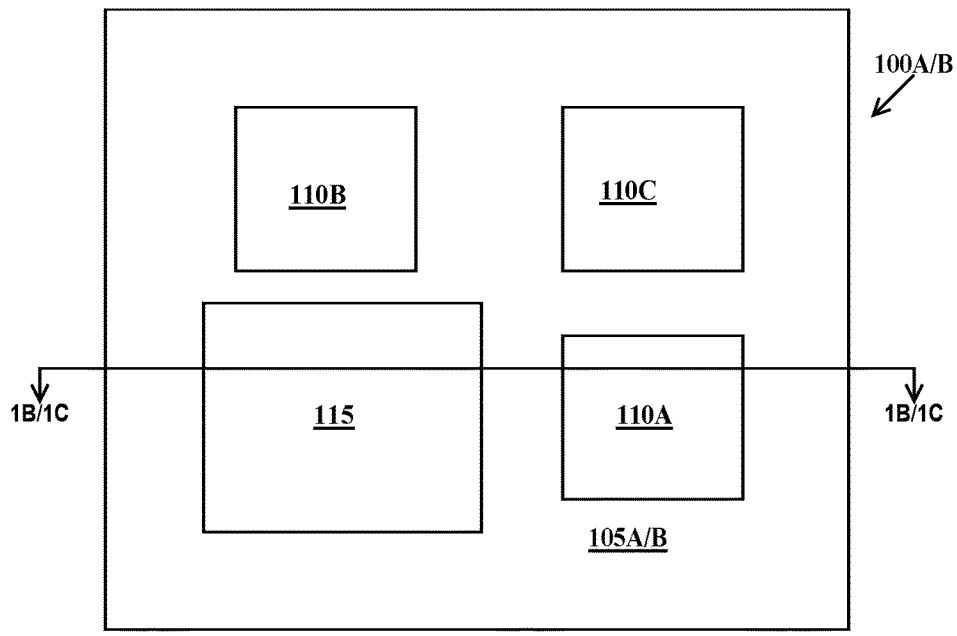
*FIG. 1A Prior Art*
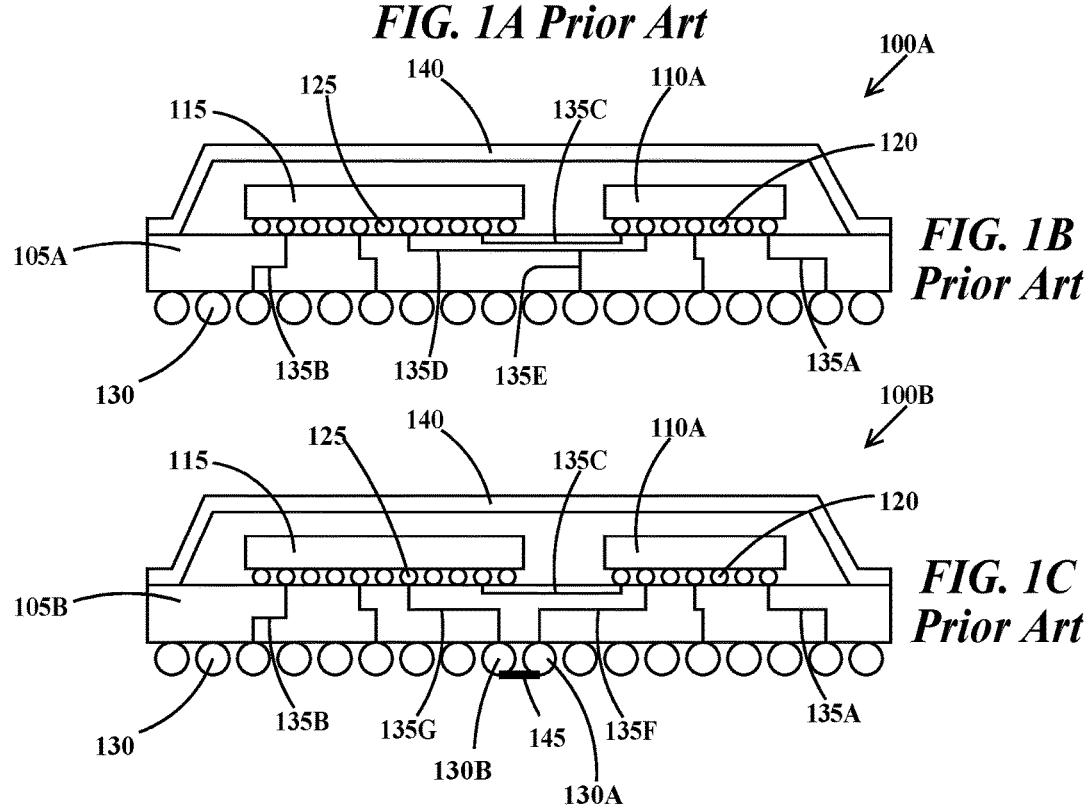
*FIG. 1B Prior Art*
*FIG. 1C Prior Art*

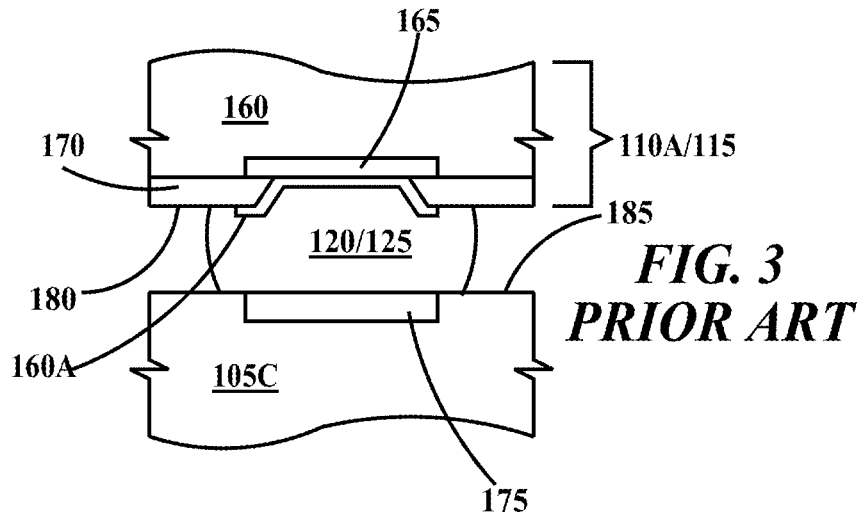
*FIG. 3*
*PRIOR ART*
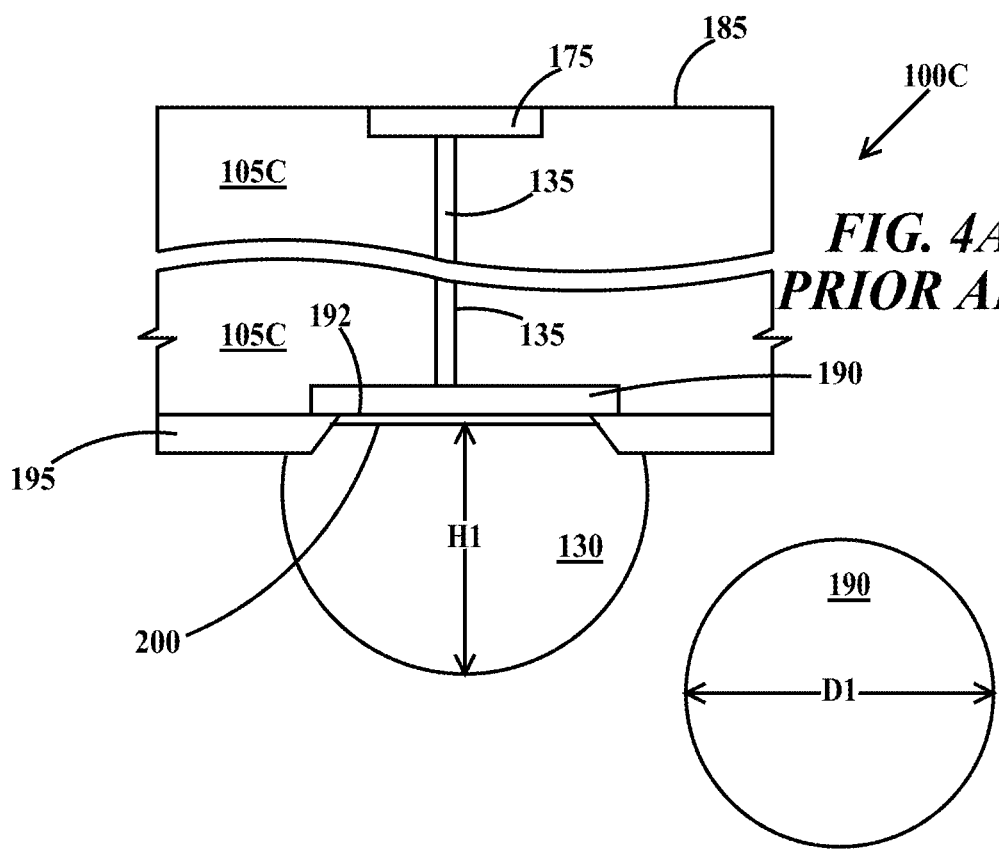
*FIG. 4A*
*PRIOR ART*
*FIG. 4B*
*PRIOR ART*

SPLIT BALL GRID ARRAY PAD FOR MULTI-CHIP MODULES

BACKGROUND

The present invention relates to the field of multi-chip modules; more specifically, it relates to a split ball grid array pad for testing and connecting integrated circuit chips on a multi-chip module.

Multi-chip modules (MCMs) allow two or more components to be interconnected in a single package. Often, one of the components is a high-value component and another is low-value component. After all components are attached the MCM is tested. If the MCM fails all the components as well as the multi-chip module itself are lost. Yield loss of MCMs can then become prohibitively high. Accordingly, there exists a need in the art to mitigate the deficiencies and limitations described hereinabove.

SUMMARY

A first aspect of the present invention is a multi-chip module, comprising: a substrate having a top surface and a bottom surface and containing multiple wiring layers, first pads on the top surface of the substrate and second pads on the bottom surface of the substrate; a first active component attached to a first group of the first pads and a second active component attached to a second group of the first pads; and wherein at least one pad of the second pads is a split pad having a first section and a non-contiguous second section separated by a gap, the first section connected by a first wire of the multiple wires to a pad of the first group of first pads and the second section is connected by a second wire of the multiple wires to a pad of the second group of first pads.

A second aspect of the present invention is a method of fabricating a multi-chip module, comprising: providing a multi-chip module comprising: a substrate having a top surface and a bottom surface and containing multiple wiring layers, first pads on the top surface of the substrate and second pads on the bottom surface of the substrate; and wherein at least one pad of the second pads is a split pad having a first section and a non-contiguous second section separated by a gap, the first section connected by a first wire of the multiple wires to a pad of the first group of first pads and the second section is connected by a second wire of the multiple wires to a pad of the second group of first pads; and attaching a first active component to the first group of the first pads; performing a first test to test the first component using the first section of the split pad; after performing and passing the first test, attaching a second active component to the second group of the first pads; after attaching the second active component, electrically connecting the first section of the split pad to the second section of the split pad; and after electrically connecting the first section of the split pad to the second section of the split pad, performing a second test to test the multi-chip module.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIG. 1A is a layout view, FIG. 1B is a section through line 1B-1B of FIG. 1A and FIG. 1C is a section through line 1C-1C of FIG. 1A of an exemplary MCM;

FIG. 3 is a cross-sectional view of component attached to a MCM according to embodiments of the present invention;

FIG. 4A is a cross-sectional view and FIG. 4B is a top view of an MCM according to embodiments of the present invention;

DETAILED DESCRIPTION

Figure 2A:
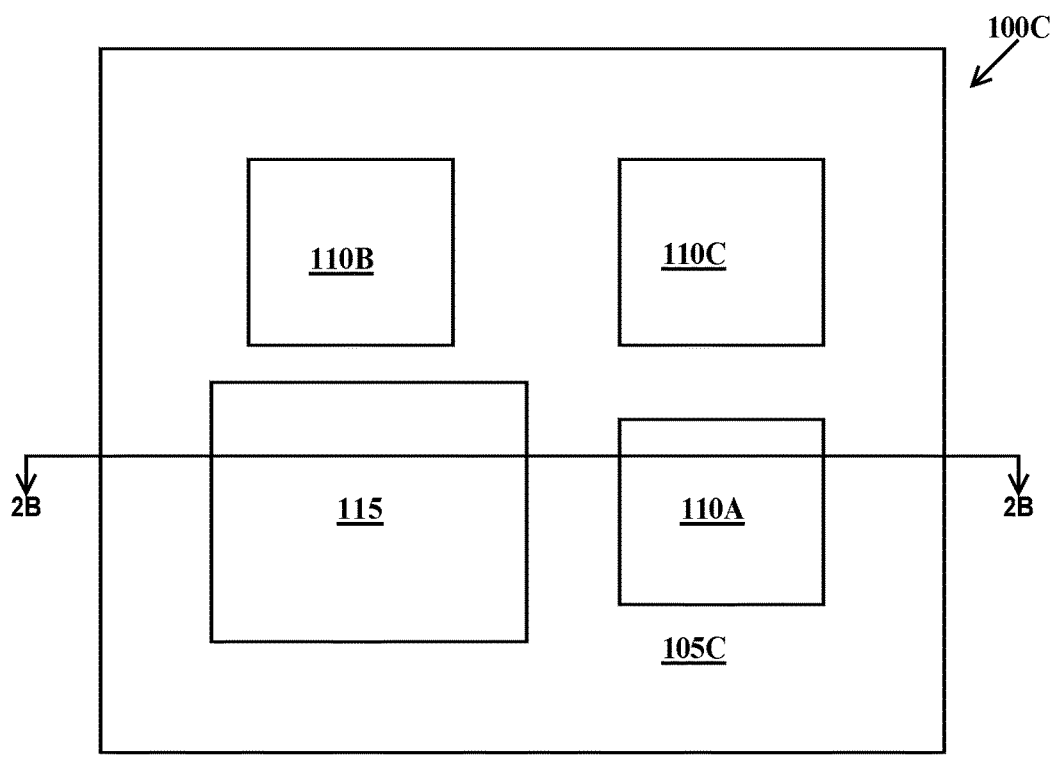
FIG. 2A is a layout view and FIG. 2B is a section through line 2B-2B of FIG. 2A of an exemplary MCM according to embodiments of the present invention.

MCMs according to embodiments of the present invention include split Ball Grid Array (BGA) pads (i.e., the pads on the bottom of the MCM that connect the MCM to higher level packages such as printed circuit boards or cards as well as non-split MCM pads. The split BGA pads bring out internal wires in the MCM that would otherwise interconnect a first component to second components. The split BGA pads allow testing of attached first components before the second components are attached to the MCM. Thus, if there is a failure due to the first components or the MCM itself, the second component is not lost. The invention is particularly useful for MCMs comprised of multiple organic layers such as printed circuit boards (PCBs) are commonly made (or other MCMs) for which no procedure exists to remove the second component from a failed MCM. MCMs may contain hundreds to several thousand BGA pads.

In describing the present invention the terms first component and second component will be used. In one example, first components are attached to MCMs using solder ball arrays. In one example, first components include, but are not limited to, integrated circuits. In one example, first components include, but are not limited to, memory integrated circuit chips, digital to analog converters (DACs), buffers, and clock circuits. In one example, second components are attached to MCMs using solder ball arrays. In one example, second components include, but are not limited to, integrated circuits. In one example, second components include, but are not limited to, application specific integrated circuits (ASICs) and microprocessors.

The present invention is particularly useful when the first component is a low-value component and the second component is a high-value component. The terms high-value and low-value are relative terms and are defined relative to each other. A high-value component is defined as a component that costs more to produce or takes longer to produce or is in shorter supply than a low-value component. What may be a low-value component (i.e., first component) on one MCM may be a high-value component (i.e., second component) on another MCM.

FIG. 1A is a layout view, FIG. 1B is a section through line 1B-1B of FIG. 1A and FIG. 1C is a section through line 1C-1C of FIG. 1A of an exemplary MCM. In FIG. 1A, an exemplary MCM 100A includes a substrate 105A/B on which a first component 110A and a second component 115 as well as a third component 110B and a fourth component 110C are attached. Components 110A, 110B, 110C and 115 are active components as opposed to passive components. Active components are defined as those devices or components which produce energy in the form of voltage or current. Examples are transistors and integrated circuits containing transistors. Passive components are defined as those devices or components which store or maintain energy in the form of voltage or current. Examples of passive components include resistors, capacitors, inductors, and transformers.

In FIG. 1B, substrate 105A is a multi-layer substrate having multiple wiring levels. First component 110A is physically attached and electrically connected to substrate 105A by an array of solder bumps 120. Third component 110B and fourth component 110C (see FIG. 1A) are similarly attached to substrate 105A. Second component 115 is physically attached and electrically connected to substrate 105A by an array of solder bumps 125. There are several connection types illustrated in FIG. 1B. In a first type of connection, a solder bump 120 of first component 110A is connected directly and only to one solder ball 130 of MCM 100A by a wire 135A. In a second type of connection, a solder bump 125 of second component 115 is connected directly and only to one solder ball 130 of MCM 100A by a wire 135B. In a third type of connection, a solder bump 120 of first component 110A is connected to a solder bump 125 of second component 115 by a wire 135C. In a fourth type of connection, a solder bump 120 of first component 110A is connected to a solder bump 125 of second component 115 by a wire 135D. Wire 135D is connected to a single solder ball 120 of MCM 100A by a stub wire 135E. There may be multiple numbers of each of the first, second, third and fourth connection types. While stub wires can be used to test first component 110A without second component 115 present on the MCM 100A, stub wires have a disadvantage of increased signal reflectivity with resultant signal loss at signal frequencies greater than 250 Mbps. Testing modules with stub connections do not accurately reflect the actual performance of the components. MCMs according to embodiments of the present invention do not use stub wires or use them only in combination with split BGA pads described infra. An optional lid 140 is illustrated in FIG. 1B to cover MCM 100A.

In FIG. 1C, substrate 105B is a multi-layer substrate having multiple wiring levels. First component 110A is physically attached and electrically connected to substrate 105B by an array of solder bumps 120. Third component 110B and fourth component 110C (see FIG. 1A) are similarly attached to substrate 105B. Second component 115 is physically attached and electrically connected to substrate 105B by an array of solder bumps 125. There are several connection types illustrated in FIG. 1C. In a first type of connection, a solder bump 120 of first component 110A is connected directly and only to one solder ball 130 of MCM 100B by a wire 135A. In a second type of connection, a solder bump 125 of second component 115 is connected directly and only to one solder ball 130 of MCM 100B by a wire 135B. In a third type of connection, a solder bump 120 of first component 110A is connected to a solder bump 125 of second component 115 by a wire 135C. In a fourth type of connection, a solder bump 120 of first component 110A is connected to a first solder ball 130A by a wire 135F and a solder bump 125 of second component 115 connected to a second solder ball 130B by a wire 135G. Solder balls 130A and 130B are then connected to each other by a wire 145 of the next level of packaging such as a PCB or card. The two sold balls connected by wire 145 may be adjacent to each other. There may be multiple numbers of each of the first, second, third and fourth connection types. While this double BGA pad scheme can be used to test first component 110A without second component 115 present on the MCM 100B, this scheme has the disadvantage of using twice the number of BGA pads as the split BGA pad scheme of the embodiments of the present invention. Up to 10-20% of the BGA pads of the MCM can be used to implement this scheme. MCMs according to embodiments of the present invention do not use the double BGA pad scheme or use them only in combination with split BGA pads described infra. Optional lid 140 is illustrated in FIG. 1C to cover MCM 100C.

Figure 2B:
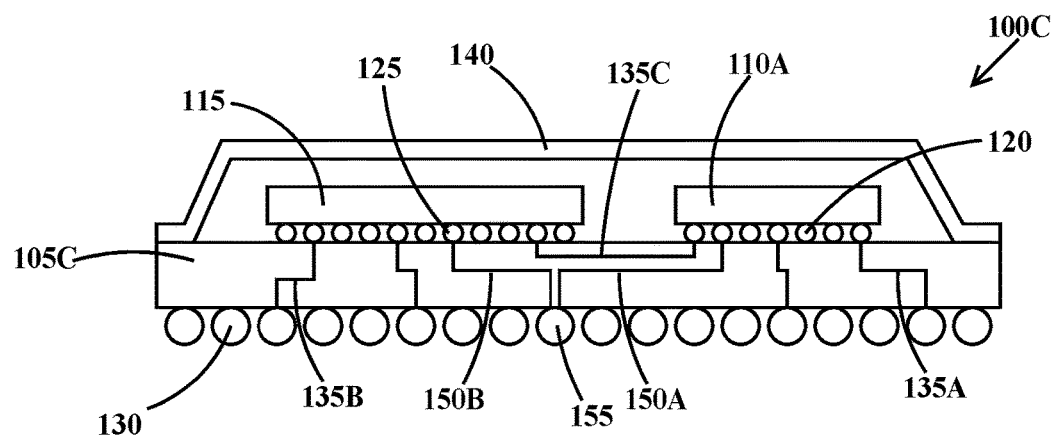

FIG. 2A is a layout view and FIG. 2B is a section through line 2B-2B of FIG. 2A of an exemplary MCM according to embodiments of the present invention. FIG. 2A is similar to FIG. 1A except MCM 100A/B having substrate 105A/B is replaced by MCM 100C having substrate 105C. In FIG. 2A, first component 110A and a second component 115A as well as third component 115B and fourth component 115C are attached to substrate 105C. Components 110A, 110B, 110C and 115 are the same as in FIGS. 1A, 1B and 1C, and are active components as defined supra.

In FIG. 2B, substrate 105C is a multi-layer substrate having multiple wiring levels. First component 110A is physically attached and electrically connected to substrate 105C by an array of solder bumps 120. Third component 110B and fourth component 110C (see FIG. 2A) are similarly attached to substrate 105C. Second component 115 is physically attached and electrically connected to substrate 105 by an array of solder bumps 125. There are several connection types illustrated in FIG. 2B. In a first type of connection, a solder bump 120 of first component 110A is connected directly and only to one solder ball 130 of MCM 100C by a wire 135A. In a second type of connection, a solder bump 125 of second component 115 is connected directly and only to one solder ball 130 of MCN 100C by a wire 135B. In a third type of connection, a solder bump 120 of first component 110A is connected to a solder bump 125 of second component 115 by a wire 135C. In a fourth type of connection, a solder bump 120 of first component 110A is connected to a first section of a split BGA pad (not shown, see FIGS. 5 and 6) by a wire 150A and a solder bump 125 of second component 115 is connected to a second section of a split BGA pad (not shown, see FIGS. 5 and 6) by a wire 150B. BGA solder ball 155 provides electrical connection of the two section of the split BGA pad thereby connecting wire 150A to wire 150B. There may be multiple numbers of each of the first, second, third and fourth connection types. Optional lid 140 is illustrated in FIG. 2B to cover MCM 105C.

FIG. 3 is a cross-sectional view of a component attached to a MCM according to embodiments of the present invention. FIG. 3 illustrates the attachment of components to MCM substrates of FIGS. 2A and 2B. In FIG. 3, a component (in this example, first component 110A or second component 115 each include a substrate 160 on which an electrically conductive component pad 165 is formed. Component pad 165 is connected to wires in substrate 160 (not shown). An optional polymeric passivation layer 170 is formed over the periphery of component pad 165. When components 110A and/or 115 are integrated circuits, substrate 160 is a semiconductor (i.e., silicon). In one example, component pad 165 comprises copper and may include a multiple layer ball limiting metallurgy (BLM) layer 160A (i.e., Ti/Cu/Ni) 160A. MCM substrate 105C includes an electrically conductive MCM pad 175. In one example, electrically conductive MCM pad 175 comprises copper. MCM pad 175 is connected to wires in substrate 105C (not shown, see FIGS. 2B and 4). A top surface 180 of component 110/115A faces a top surface 185 of MCM substrate 105C. Solder ball 120/125 connects component pad 165 to MCM pad 175. This is called flip-chip mounting. In one example, component pads 165 and MCM pads 175 are circular disks.

FIG. 4A is a cross-sectional view and FIG. 4B is a top view of an MCM according to embodiments of the present invention. In FIG. 4A, substrate 105C of MCM 100C includes MCM pad 175 and a conventional BGA pad 190 connected by a typical wire 135. A conventional pad is defined as a pad having a contiguous top surface. An optional polymeric passivation layer 195 is formed over the periphery of conventional BGA pad 190. In one example, conventional BGA pad 190 includes an optional surface layer(s) 200, examples of which include, but are not limited to copper organic solderability preservative (CuOSP), Ni/Au layers and Ni/Pb/Au layers. Solder ball 130 is formed on conventional BGA pad 190. BGA pads 190 are not split BGA pads but are used in combination with split BGA pads. Split BGA pads are described infra. In FIG. 4B, conventional BGA pad 190 has a diameter of D1. In one example, D1 is between 400 μm and 800 μm. Solder ball 130 has a maximum height H1 measured perpendicular to a bottom surface 192 of substrate 105C.

Figure 5:
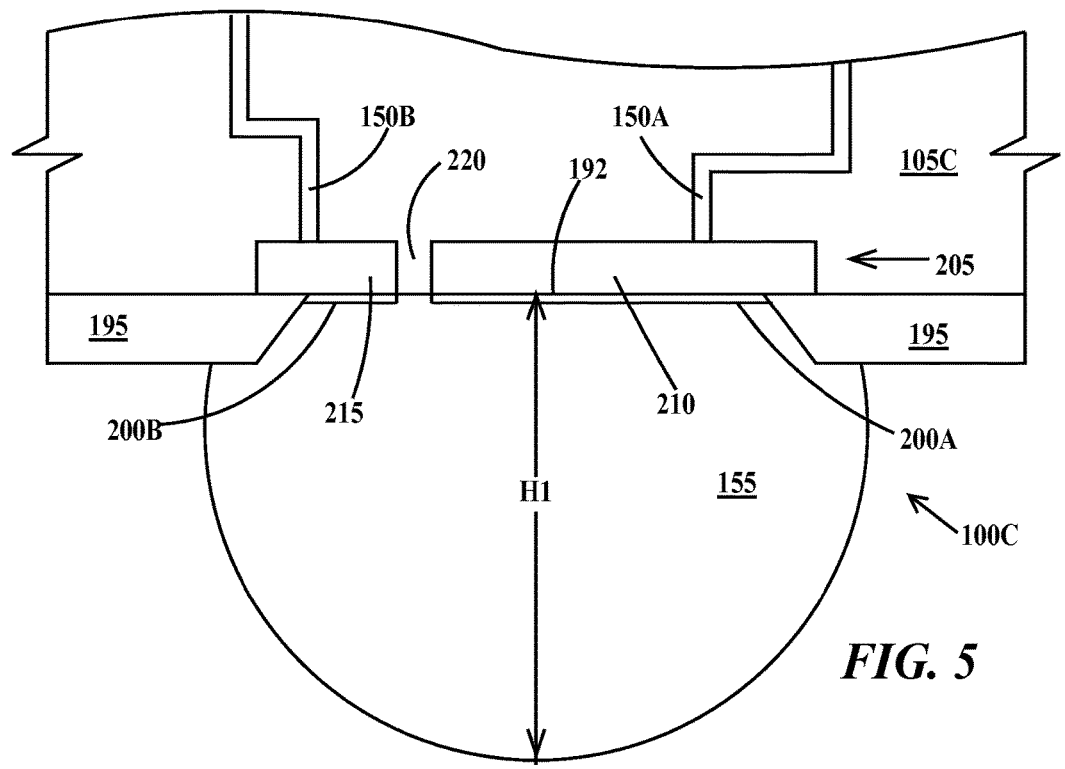
FIG. 5 is a cross-sectional view of a MCM illustrating a split MCM pad according to embodiments of the present invention.

FIG. 5 is a cross-sectional view of a MCM illustrating a split MCM pad according to embodiments of the present invention. In FIG. 5, substrate 105C of MCM 100C includes a split BGA pad 205 including a first section 210 and a second section 215 that are separated by a gap 220 First section 210 is connected to wire 150A which connects to first component 110A as illustrated in FIG. 2B and described supra. Second section 215 is connected to wire 150B which connects to second component 115 as illustrated in FIG. 2B and described supra. Optional polymeric passivation layer 195 is formed over the periphery of split BGA pad 205. In one example, split BGA pad 205 includes an optional surface layer(s) 200A on section 210 and 200B on section 215, examples of which include, but are not limited to CuOSP, Ni/Au layers and Ni/Pb/Au layers. Solder ball 155 is formed on first section 210 and second section 215 of BGA pad 205 and over gap 220. Solder ball 155 electrically connects first section 210 and second section 215 of split BGA pad 205. Solder ball 155 has a maximum height H1 measured perpendicular to a bottom surface 192 of substrate 105C. Solder ball 155 is a full height solder ball.

Figure 6:
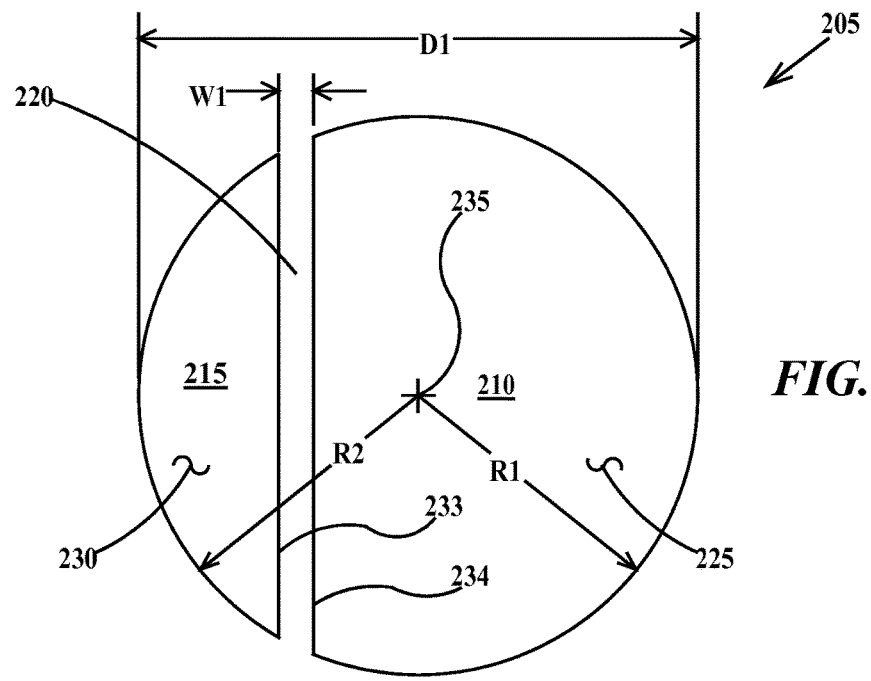
FIG. 6 is a top view of the split MCM pad of FIG. 5.

FIG. 6 is a top view of the split BGA pad of FIG. 5. In FIG. 6, optional passivation layer 195 and optional surface layers 200A and 200B of FIG. 5 are not illustrated in FIG. 6 for clarity. In FIG. 6, since gap 220 separates first section 210 from second section 215, split BGA pad 205 does not have a contiguous top surface. First section 210 does not physically abut second section 215 nor is electrical contact with second section 215. First section 210 and second section 215 of split BGA 205 have respective top surfaces 225 and 230 that are circular segments. A circular segment is a region of two-dimensional space that is bounded by an arc (of less than 180°) of a circle and by the chord connecting the endpoints of the arc. The chord 233 of the circular segment defining flat edge of second section 215 and the chord 234 of the circular segment defining the flat edge of first section 210 define gap 220. Cords 232 and 234 are illustrated as parallel but they do not need to be parallel. The radius of the arc of the circular section defining the curved edge of first section 210 is R1 and the radius of the arc of the second circular segment defining the curved edge of second section 215 is R2 with R1=R2 and R1 and R2 sharing a same center point 235. The area of the surface 225 of first section 210 is greater than the area of the surface 230 of second section 215. Overall split BGA pad 205 (including gap 220) has a diameter D1. R1 is D1/2 and R2 is D1/2. Gap 220 has a width W1. In one example, D1 is s between 400 nm and 800 nm. Thus the diameter of BGA pads 190 of FIG. 4A are the same as diameter of split BGA pads 205 of FIG. 6. BGA pads 205 occupy the same amount of area (have the same footprint) as BGA pads 190 of FIG. 4A. In one example, W1 is between 10 nm and 100 nm. In one example, the area of surface 225 is between 60% and 80% of the total area of surfaces 225 and 230 with 80% preferred. In one example, the area of surface 230 is between 20% and 40% of the total area of surfaces 225 and 230 with 20% preferred. The area of first section 210 is greater than the area of second section 215 is to accommodate landing of probe tips on first section 210 in order to test the support component 110A of FIG. 2B before placing sold balls 130 on MCM 100C.

Figure 7:
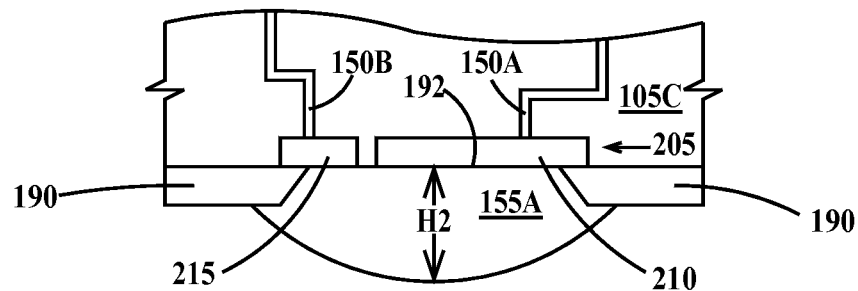
FIG. 7 is a cross-sectional view of a MCM illustrating an alternative method of connecting the two portions of the split MCM of FIG. 6.

FIG. 7 is a cross-sectional view of a MCM illustrating an alternative method of connecting the two portions of the split MCM of FIG. 6. Since solder ball 130 of FIG. 4A has the same height H1 as solder ball 155 of FIG. 5 (i.e., they are both conventional solder balls) there will be a solder ball connection to any pad on the next level of packaging directly under split BGA pad 205. If it is desired not to make this connection, the next level of packaging may be designed not to have a pad in this location. This would be the preferred methodology. FIG. 7 is similar to FIG. 5 except solder ball 155 is replaced by solder ball 155A. Solder ball 155A has a maximum height H2 measured perpendicular to a bottom surface 217 of substrate 105C. H2 is less than H1 of solder ball 155 of FIG. 5 so solder ball 155A only connects wires 150A to wire 150B and does not connect to any pads of the next level of packaging that may be under solder ball 155A because its height is not sufficient to contact pads of the next level of packaging. Solder ball 155A is a reduced height solder ball.

MCMs according to embodiments of the present invention use (i) a combination of BGA pads 190 with full height solder balls 130 (see FIG. 4A) and split BGA pads 205 with full height solder balls 155 (see FIGS. 5, and 6), (ii) of BGA pads 190 with full height solder balls 130 (see FIG. 4A) and split BGA pads 205 with reduced height solder balls 155A (see FIG. 7) or (iii) combination of BGA pads 190 with full height solder balls 130 (see FIG. 4A), split BGA pads 205 with full height solder balls 155 (see FIGS. 5 and 6) and split BGA pads 205 with reduced height solder balls 155A (see FIG. 7).

Figure 8:
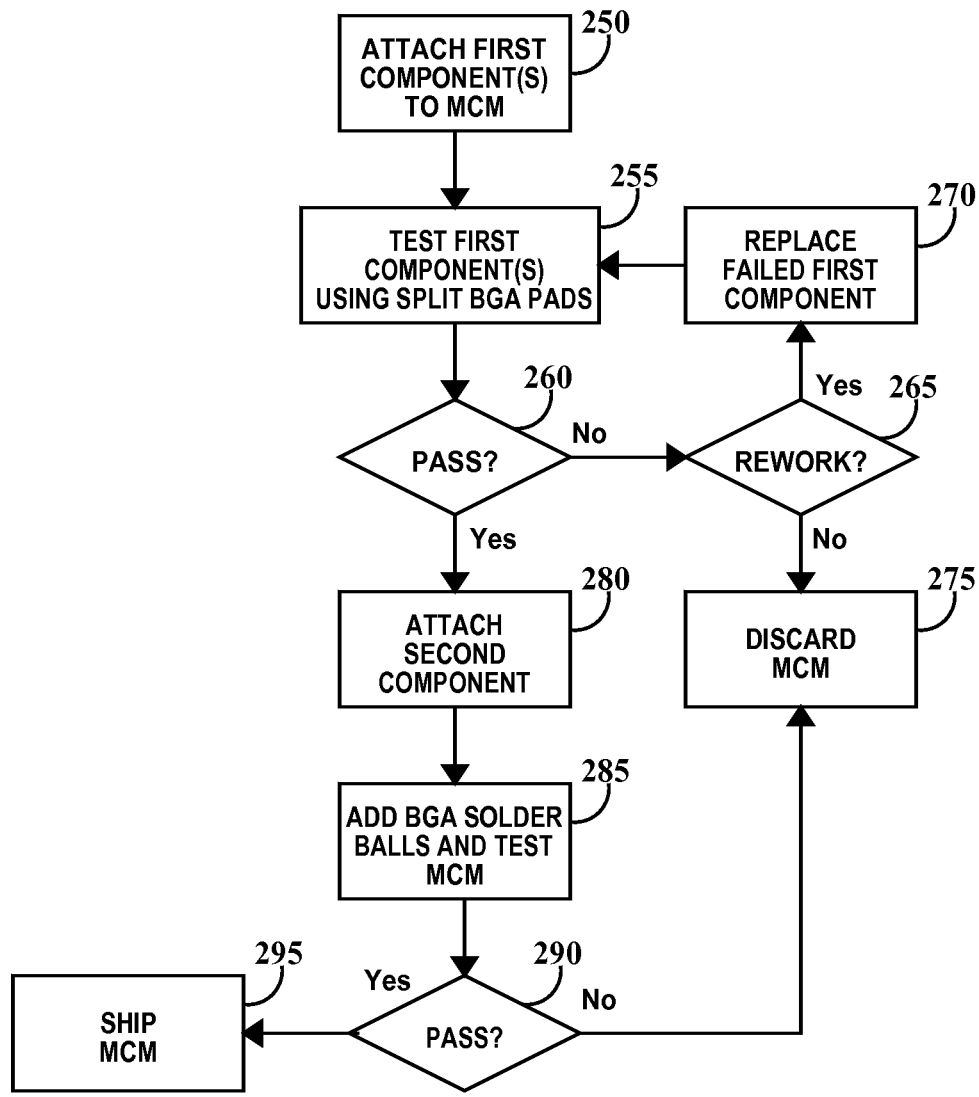
FIG. 8 is a flowchart illustrating fabricating and testing a MCM having split MCM pads according to embodiments of the present invention.

FIG. 8 is a flowchart illustrating fabricating and testing a MCM having split MCM pads according to embodiments of the present invention. In step 250, one or more first components that were previously tested good before attaching to the MCM are attached to an MCM using solder bumps. In step 255, one or more of the one or more first components are component tested using the split-BGA pads. Testing is accomplished by contacting the surfaces of larger sections (which are the sections connected to the one or more first components) of the split BGA pads with a probes connected to a tester. Additional probes may contact conventional BGA pads connected to the one or more first components. This is a functional test of just first components. In step 260, if a first component fails the method proceeds to step 265 where it is determined if the MCM can be reworked. If rework is possible and desirable, the method proceeds to step 270 where the failed first component or components are replaced and the method loops back to step 255. If, in step 265, it is determined that rework is not possible or not desirable the method proceeds to step 275 where the MCM is discarded or scrapped and the method terminates.

Returning to step 260, if in step 260, all the tested first components pass then in step 280 one or more second components are attached to the MCM by solder bumps. In step 285, solder balls are attached to the MCM and the MCM is MCM tested by contacting all full size solder balls. This is functional test of the whole module. Next, in step 290, if the MCM fails the test, the method proceeds to step 275 where the MCM is discarded and the method terminates. The most likely cause of fail in this case would be a failure of a second component. If, in step 290, the MCM passes the method proceeds to step 295 and the MCM is shipped or sent to stock.

Thus the embodiments of the present invention provide split MCM pads to bring out internal wires in the MCM that would otherwise interconnect first or low-value components to second or high-value components to allow testing of the MCM with attached first or low-value components before the second or high-value components are attached to the MCM reducing the loss of high-value or second components.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multi-chip module, comprising:
    a substrate having a top surface and a bottom surface and containing multiple wiring layers, each of said multiple wiring layers having multiple wires, first pads on said top surface of said substrate and second pads on said bottom surface of said substrate;
    a first active component attached to a first group of said first pads and a second active component attached to a second group of said first pads, wherein one pad of said second pads is a split pad having a first section and a non-contiguous second section separated by a gap, said first section connected by a first wire of said multiple wires to a pad of said first group of said first pads and said non-contiguous second section connected by a second wire of said multiple wires to a pad of said second group of said first pads, and wherein another pad of said second pads is a conventional pad having a contiguous top surface and a contiguous bottom surface;
    a first solder ball in direct physical contact with said contiguous bottom surface of said conventional pad and connected to a next level of packaging under said conventional pad; and
    a second solder ball in direct physical contact with said first and second sections of said split pad,
    wherein said first solder ball has a first height in a first direction and said second solder ball has a second height in said first direction, wherein said first direction is perpendicular to said contiguous bottom surface of said conventional pad, and wherein said second height is sufficiently less than said first height such that said second solder ball is not connected to said next level of packaging.

2. The multi-chip module of claim 1, further including:
    a first set of wires of said multiple wiring layers directly connecting a first set of said first group of said first pads to a first set of said second group of said first pads;
    a second set of wires of said multiple wiring layers connecting a second set of said first group of said first pads to a first set of said second pads;
    a third set of wires of said multiple wiring layers connecting a second set of said second group of said first pads to a second set of said second pads; and
    wherein said first active component includes first component pads attached to said first group of said first pads by solder bumps and said second active component includes second component pads attached to said second group of said first pads by solder bumps.

3. The multi-chip module of claim 1, wherein said split-pad, including said gap, has occupies an area of said bottom surface of said substrate equal to the area of said bottom surface of said substrate occupied by said conventional pad having said contiguous top surface.

4. The multi-chip module of claim 1, wherein an area of a top surface of said first section is greater than an area of a top surface of said non-contiguous second section.

5. The multi-chip module of claim 1, wherein:
    said first section has the shape of a first circular segment bounded by a first arc of a circle and by a first chord connecting the endpoints of said first arc;
    said non-contiguous second section has the shape of a second circular segment bounded by a second arc of said circle and by a second chord connecting the endpoints of said second arc;
    said gap defined the space between said first and second cord; and
    a first radius of said first circular segment is the same as a second radius of said second circular segment, said first and second radius measured from the center of said circle.

6. The multi-chip module of claim 1, wherein said first active component is a first integrated circuit chip and said second active component is a second integrated circuit chip.

\* \* \* \* \*